(12) United States Patent
Yazaki et al.

(10) Patent No.: US 6,972,070 B2
(45) Date of Patent: Dec. 6, 2005

(54) METHOD OF MANUFACTURING A PRINTED WIRING BOARD

(75) Inventors: Yoshitaro Yazaki, Anjo (JP); Yoshihiko Shiraishi, Nagoya (JP); Koji Kondo, Toyohashi (JP); Toshikazu Harada, Kariya (JP); Tomohiro Yokochi, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/643,919

(22) Filed: Aug. 20, 2003

(65) Prior Publication Data

US 2004/0052932 A1 Mar. 18, 2004

Related U.S. Application Data

(62) Division of application No. 10/024,470, filed on Dec. 21, 2001, now Pat. No. 6,641,898.

(30) Foreign Application Priority Data

| Dec. 26, 2000 | (JP) | ............................. 2000-395601 |
| Mar. 28, 2001 | (JP) | ............................. 2001-094176 |
| Jul. 25, 2001 | (JP) | ............................. 2001-224962 |
| Nov. 2, 2001 | (JP) | ............................. 2001-338119 |

(51) Int. Cl.$^7$ ............................................. H05K 3/00
(52) U.S. Cl. ..................... 156/308.2; 427/96; 174/257; 174/264
(58) Field of Search .................... 156/308.2; 428/209, 428/901; 174/257, 264, 265; 427/96, 376.1, 427/123, 125

(56) References Cited

U.S. PATENT DOCUMENTS

| 3,947,956 A | 4/1976 | Leroux et al. |
| 4,435,611 A | 3/1984 | Ohsawa et al. |
| 4,713,494 A | 12/1987 | Oikawa et al. |
| 4,795,670 A | 1/1989 | Nishigaki et al. |
| 5,031,308 A | 7/1991 | Yamashita et al. |
| 5,280,414 A | 1/1994 | Davis et al. |
| 5,439,164 A | 8/1995 | Hasegawa et al. |
| 5,551,626 A | 9/1996 | Hasegawa et al. |
| 5,573,622 A | 11/1996 | Hass et al. |
| 5,744,758 A | 4/1998 | Takenouchi et al. |
| 5,746,868 A | 5/1998 | Abe |
| 5,879,788 A | 3/1999 | Fukuta et al. |
| 5,906,042 A | 5/1999 | Lan et al. |

(Continued)

FOREIGN PATENT DOCUMENTS

EP 0 793 405 9/1997

(Continued)

OTHER PUBLICATIONS

S.K. Kang et al. "Development of Conductive Adhesive Materials for Via Fill Applications", 2000 Electronic Components and Technology Conference, 2000, pp. 887-891.

Primary Examiner—Melvin Mayes
(74) Attorney, Agent, or Firm—Posz Law Group, PLC (57) ABSTRACT

A heated and pressed printed wiring board is made by filling via holes formed in layers of insulating film of the wiring board with an interlayer conducting material. The insulating film is stacked with conductor patterns, and each conductor pattern closes a via hole. The interlayer conducting material forms a solid conducting material in the via holes after a heating a pressing procedure. The solid conducting material includes two types of conducting materials. The first type of conducting material includes a metal, and the second type of conductive material includes an alloy formed by the metal and conductor metal of the conductor patterns. The conductor patterns are electrically connected reliably without relying on mere mechanical contact.

3 Claims, 9 Drawing Sheets

U.S. PATENT DOCUMENTS

| | | |
|---|---|---|
| 5,948,533 A | 9/1999 | Gallagher et al. |
| 5,972,482 A | 10/1999 | Hatakeyama et al. |
| 5,977,490 A | 11/1999 | Kawakita et al. |
| 6,000,129 A | 12/1999 | Bhatt et al. |
| 6,133,366 A | 10/2000 | Thetford et al. |
| 6,139,777 A | 10/2000 | Omoya et al. |
| 6,143,116 A | 11/2000 | Hayashi et al. |
| 6,195,882 B1 | 3/2001 | Tsukamoto et al. |
| 6,207,259 B1 * | 3/2001 | Iino et al. .................... 428/209 |
| 6,440,542 B1 | 8/2002 | Kariya |
| 6,459,046 B1 | 10/2002 | Ochi et al. |
| 6,641,898 B2 * | 11/2003 | Yazaki et al. ................ 428/209 |
| 6,703,565 B1 | 3/2004 | Tsukamoto et al. |
| 2004/0066633 A1 * | 4/2004 | Yazaki et al. ................ 361/748 |

FOREIGN PATENT DOCUMENTS

| | | |
|---|---|---|
| JP | A-7-176846 | 7/1995 |
| JP | A-11-214575 | 8/1999 |
| JP | A-11-251703 | 9/1999 |
| JP | A-11-251751 | 9/1999 |
| JP | A-2000-049460 | 2/2000 |
| JP | A-2000-138457 | 5/2000 |
| JP | A-2000-236166 | 8/2000 |

* cited by examiner

FIG. 14 form a stack such that the via holes are located between the conductor patterns in the stack. Further, the method includes forming a solid conductive material in each of the via holes to electrically connect the connector patterns by heating the
METHOD OF MANUFACTURING A PRINTED WIRING BOARD

CROSS REFERENCES TO RELATED APPLICATIONS

This application is a divisional application of U.S. patent application Ser. No. 10/024,470, filed Dec. 21, 2001, now U.S. Pat. No. 6,641,898 which relates to and incorporates herein by reference Japanese Patent Application 2001-338119 (filed on Nov. 2, 2001).

BACKGROUND OF THE INVENTION

The present invention relates to printed wiring boards and methods of manufacturing printing boards, and more particularly to a printed wiring board that is a double-sided printed wiring board or a multilayer printed wiring board with a plurality of electrically-interconnected conductor pattern layers, and to the manufacturing method thereof.

In Japanese Patent Application No. 7-176846, conductor patterns on a printed wiring board are interconnected electrically by packing conductive paste, which contains metal particles and binder resin, in a via hole formed in the printed wiring board and by pressing the paste in the presence of heat. However, in that publication, interconnection between the conductor patterns is achieved by contact conduction between metal particles in the via hole and by contact conduction between the metal particles and the conductor patterns. Therefore, if the printed wiring board is used in thermally harsh conditions, such as in a vehicle, the interlayer connection resistance is likely to vary.

For example, in a high temperature environment, the reliability of the interconnection is lowered by an increase in interlayer connection resistance because the contact resistances between metal particles and between the metal particles and the conductor patterns increase due to thermal expansion of the binder resin. The problem becomes more critical as the density of the printed wiring board increases.

The present invention has been made accordingly to provide a more reliable printed wiring board.

BRIEF SUMMARY OF THE INVENTION

Basically, the invention is a printed wiring board formed by interconnected layers. Each layer includes an insulator film, in which a via hole is formed. A conductor pattern located on the insulator film, and the conductor pattern includes a conductor metal. A solid conductive material is located in the via hole. The solid conductive material includes a first type of conductive material and a second type of conducting material. The first type of conducting material includes a metal, and the second type of conductive material includes an alloy formed by the metal and the conductor metal.

The invention is also a method of making a printed wiring board. The method includes packing via holes formed in an insulator material with an interlayer conducting material. The interlayer conducting material includes a first metal material and a second metal material, and the second metal material melts at a temperature higher than a predetermined temperature. The method further includes stacking layers of the insulator film with conductor patterns to form a stack such that the via holes are located between the conductor patterns in the stack. Further, the method includes forming a solid conductive material in each of the via holes to electrically connect the connector patterns by heating the stack to the predetermined temperature and pressing the stack. The solid conductive material of each via hole includes a unified conductive layer and a solid phase diffusion layer. The solid phase diffusion layer is formed by the first metal material and a conductor metal, and the conductor metal is a metal of the associated conductor pattern.

DETAILED DESCRIPTION OF THE PREFERRED EMBODIMENTS (First Embodiment)

Figure 1A:
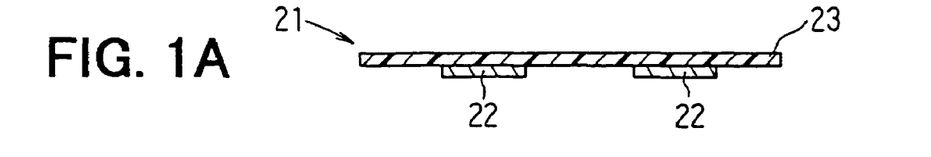
FIG. 1(a) is a diagrammatic cross sectional view showing a step in the manufacture of printed wiring boards according to the present invention.

In FIG. 1(a), a single-sided conductor pattern film 21 having a conductor pattern 22 is defined by etching a conductive foil (a copper foil with 18 μm thickness in this embodiment) adhered to one side of a resin film 23. In this embodiment, a thermoplastic film, which is 25–75 μm thick and made of a mixture of 65–35% polyetheretherketone resin and 35–65% polyetherimide resin, is used as the resin film 23.

Figure 1B:
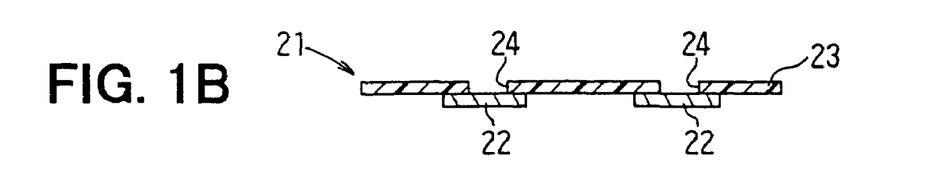
FIG. 1(b) is a view like FIG. 1(a) showing a further step in the manufacture of the printed wiring boards.

After the formation of the conductor pattern 22 is completed as shown in FIG. 1(a), a substantially cylindrical via hole 24, for which the conductor pattern 22 serves as a bottom surface, is formed by exposure to a carbon dioxide laser from the side of the resin film 23, as shown in FIG. 1(b). During the formation of the via hole, the conductor pattern is not perforated if the power and the exposure period of the carbon dioxide laser are set properly.

Other than the carbon dioxide laser, an excimer laser or the like may be used for formation of the via hole 24. In addition to a laser, other ways of forming the via hole such as drilling may also be used. However, machining by laser beam is preferred because of its ability to machine a fine hole without damage to the conductor pattern 22.

Figure 1C:
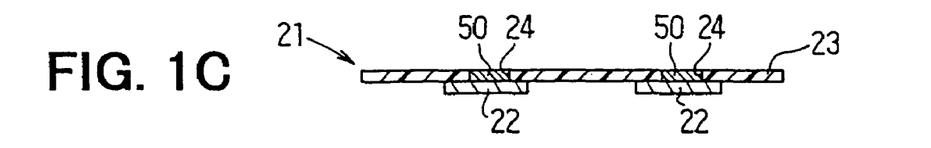
FIG. 1(c) is a view like FIG. 1(a) showing a further step in the manufacture of the printed wiring boards.

After the formation of the via hole 24 is completed, as shown in FIG. 1(b), conductive paste 50, which is a material for interlayer connection, is packed in the via hole 24 as shown in FIG. 1(c).

The paste is prepared by the steps described below. Terpineol, an organic solvent, the quantity of which is 60 g, is added to 300 g of tin particles. The tin particles are sometime referred to herein as first metal particles, and tin is sometimes referred to as a first metal. The mean particle size of the tin particles is 5 μm, and the specific surface area of the tin particles is 0.5 $m^2/g$. Further, 300 g of silver particles, which are sometimes referred to herein as second metal particles, are added. Silver is sometimes referred to herein as a second metal. The silver particles have a mean particle size of 1 μm and a specific surface area of 1.2 $m^2/g$. The mixture is mixed to a paste by a mixer. The paste-like consistency of the material facilitates filling the via holes.

The conductive paste 50 is applied, or printed, and packed in the via hole 24 of the single-sided conductor pattern film 21 by a screen printing machine with a metal mask, and the terpineol is evaporated at 140–160 degrees (all temperatures herein are expressed in degrees Celsius) for 30 minutes. In this embodiment, the screen printing machine is used for packing the conductive paste 50 into the via hole 24. However, other methods such as applying the paste with a dispenser or the like are may be used as long as the method reliably packs the paste.

Instead of terpineol, other organic solvents may be used to make the paste. An organic solvent with a boiling point of 150–300 degrees is preferred. If organic solvents having boiling point of 150 degrees or lower are used, time-dependent variation of the viscosity of the conductive paste 50 increases. On the other hand, organic solvents having boiling points higher than 300 degrees have long evaporation times, and this slows production.

In this embodiment, the conductive paste 50 includes metal particles, namely the tin particles and the silver particles. The metal particles preferably have a mean particle size of 0.1–20 μm and a specific surface area of 0.1–2.5 $m^2/g$.

If the metal particles have a mean particle size smaller than 0.1 μm or a specific surface area larger than 2.5 $m^2/g$, a lot of organic solvent is required to create a suitable viscosity for via hole packing. Conductive paste containing a lot of organic solvent requires a relatively long time for evaporation, and relatively more gas is generated during the heating and interconnecting step if the evaporation is insufficient. Therefore, voids are likely to be generated in the via hole 24, which lower the reliability of the interconnection.

On the other hand, if the metal particles have a mean particle size larger than 20 μm or a specific surface area smaller than 0.1 $m^2/g$, packing the paste into the via hole 24 becomes difficult. In addition, the metal particles will tend to be unevenly distributed, which makes it difficult to create a homogeneous conductive alloy compound 51 after heating. Thus, it is difficult to ensure the reliability of the interconnection.

Before the conductive paste 50 is packed into the via hole 24, the surface of the conductor pattern 22 facing the via hole 24 may be slightly etched or chemically reduced to improve solid phase diffusion, which is described later.

Figure 1D:
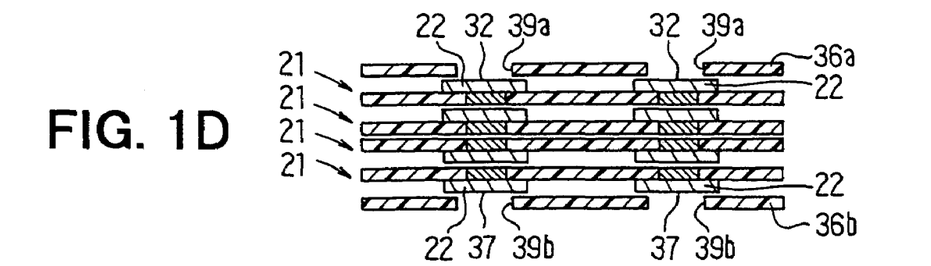
FIG. 1(d) is a view like FIG. 1(a) showing a further step in the manufacture of the printed wiring boards.

When the conductive paste 50 has been packed into the via hole 24 and the evaporation of the terpineol is completed, a plurality of single-sided conductor pattern films 21 (four films in this embodiment) are stacked as shown in FIG. 1(d). The two single-sided conductor pattern films 21 of the lower side are stacked such that the side including the conductor pattern 22 faces downward. The two single-sided conductor pattern films 21 of the upper side are stacked such that the side including the conductor pattern 22 faces upward.

The two inside single-sided conductor pattern films 21 are stacked together such that the sides having no conductor patterns 22 face each other. The two outer single-sided conductor pattern films 21 are stacked such that the sides including the conductor patterns 22 face outward as shown.

A top cover layer 36a, which is a resist film that covers the conductor pattern 22 of the top layer, is placed on the top of the stack of films 21 as shown. A bottom cover layer 36b, which is another resist film that covers the conductor pattern 22 of the bottom layer, is located at the bottom of the stack of films 21 as shown.

The top cover layer 36a is machined to provide a hole through which an electrode 32 is exposed in a predetermined position of the conductor pattern 22 on the top layer. The bottom cover layer 36b is machined to provide another hole through which an electrode 37 is exposed in a predetermined position of the conductor pattern 22 on the bottom layer. In this embodiment, the resin material described previously with respect to the resin film 23 is used for the cover layers 36a and 36b.

After stacking the single-sided conductor pattern films 21 and the cover layers 36a and 36b as shown in FIG. 1(d), the stacked unit is hot-pressed from the top and the bottom surfaces by a vacuum hot-press machine. In this embodiment, the stacked unit is pressed for 10–20 minutes under 2–10 MP pressure at a temperature of 240–350 degrees.

Figure 1E:
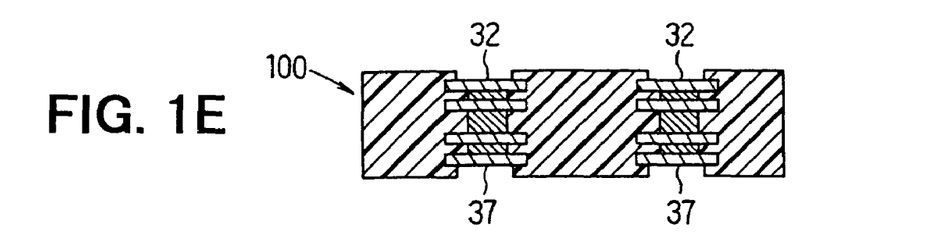
FIG. 1(e) is a view like FIG. 1(a) showing a further step in the manufacture of the printed wiring boards.

Thus, as shown in FIG. 1(e), the single-sided conductor pattern films 21 and the cover layers 36a, 36b are bonded together. While the resin films 23 and the cover layers 36a, 36b thermally fuse together into a unit, the conductor patterns 22 adjacent to the conductive paste 50 in the via hole 24 are interconnected and a multilayer printed wiring board 100 with the electrodes 32 and 37 at the surfaces is provided. The resin film 23 and the cover layers 36a, 36b are made of the same thermoplastic resin so that they are unified by being thermally softened and pressed. In this fabrication process, the process shown in FIG. 1(c) is a packing step and the processes shown in FIGS. 1(d) and 1(e) are interconnecting steps.

Figure 2A:
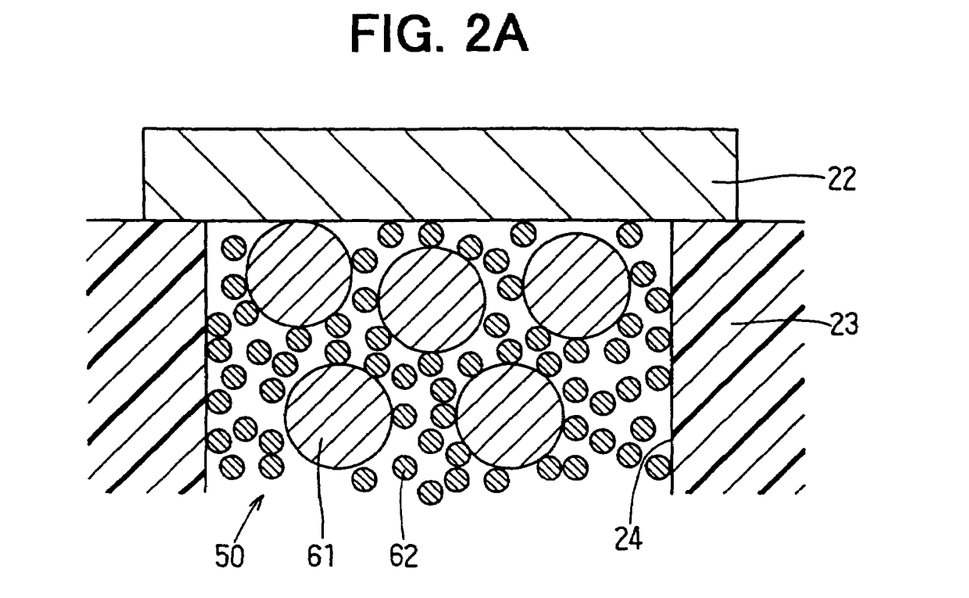
FIG. 2(a) is an enlarged diagrammatic cross sectional view showing a step in the manufacture of a printed wiring board according to a first embodiment of the present invention.
Figure 2B:
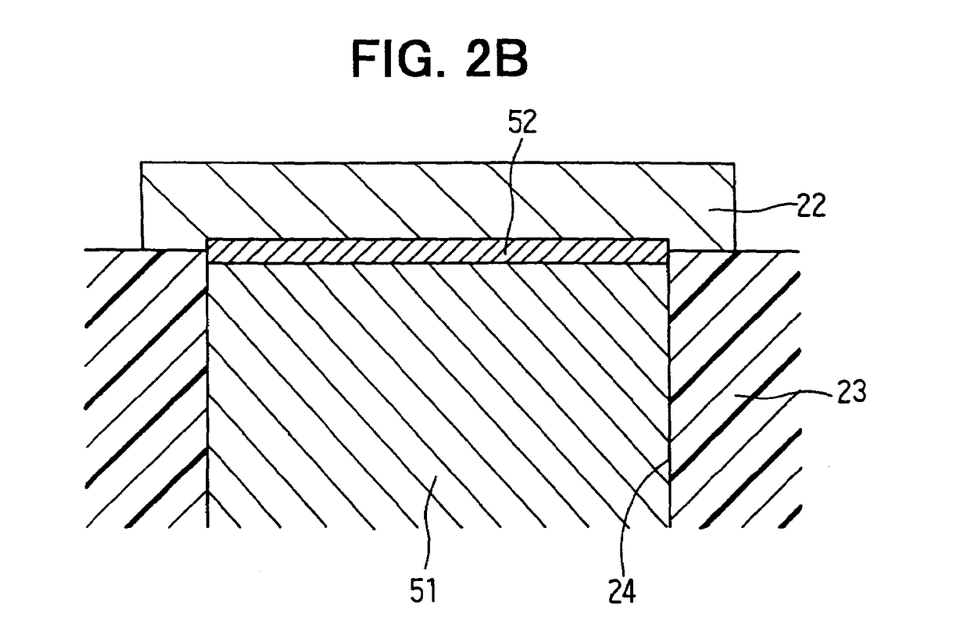
FIG. 2(b) is a view like FIG. 1(a) showing a further step in the manufacture of the printed wiring board.

Hereinafter, the interconnection is explained by referring to FIG. 2(a) and FIG. 2(b). FIG. 2(a) and FIG. 2(b) are partial, enlarged views diagrammatically showing a representative one of the via holes 24. Before being heated by the vacuum hot-press machine, the paste 50 packed in the via hole 24 and subjected to evaporation is in the state shown in FIG. 2(a). In this state, both the first metal particles 61 (tin) and the second metal particles 62 (silver) are mixed.

When the paste 50 is heated to 240–350 degrees, the tin particles melt and adhere to the surface of the silver particles, because the melting point of the tin particles 61 and that of the silver particles are 232 degrees and 961 degrees, respectively. As the heating continues, fused tin begins diffusing from the surface of the silver particles, and an alloy (melting point, 480 degrees) is formed with tin and silver. With the tin-silver alloy formation, as shown in FIG. 2(b), a conductive compound 51, which is a sintered alloy, is formed in the via hole 24 because the conductive paste 50 is under pressure of 2–10 MP.

In addition, while the conductive compound 51 is formed in the via hole 24, the pressurized conductive compound 51 is pressed toward the surface forming the bottom of the via hole 24. Thus, the tin in the conductive compound 51 and copper in the copper foil forming the conductor pattern 22 diffuse mutually, and a solid phase diffusion layer 52 is formed at the interface between the conductive compound 51 and the conductor pattern 22.

Similarly, although not shown in FIG. 2(b), a solid phase diffusion layer is also formed by the tin in the conductive compound 51 and the copper in the copper foil of the conductor pattern 22 between the conductor pattern 22 and the conductive compound 51 in the via holes 24 in which the conductive patterns 22 form a bottom wall in the holes 24. Therefore, conductor patterns 22 at the top and bottom of the via hole 24 are electrically interconnected with the unified conductive compound 51 and the solid phase diffusion layer 52.

According to the configuration and the fabrication method described above, conductor patterns 22 of the printed wiring board 100 are electrically interconnected with both the unified conductive compound 51 made of tin-silver alloy sintered in the via hole 24 and the solid phase diffusion layer 52 made from tin and copper between the conductor pattern 22 and the conductive compound 51. Therefore, electrical interconnection between the conductor patterns 22 is not achieved by mere mechanical contact and there is very little interlayer contact resistance. Therefore, the reliability of the interconnection is high.

In addition, stacked unification of the single-sided conductor pattern films 21 and the cover layer 36a, 36b and interconnection of the conductor patterns 22 are performed simultaneously by the hot-press. Therefore, the number of fabrication steps for making the printed wiring board 100 is reduced along with the fabrication costs of the board.

In this embodiment, the metal components of the conductive paste 50 consist of 50 weight % tin and 50 weight % silver. The tin content in the metal components is preferably 20–80%.

Figure 3:
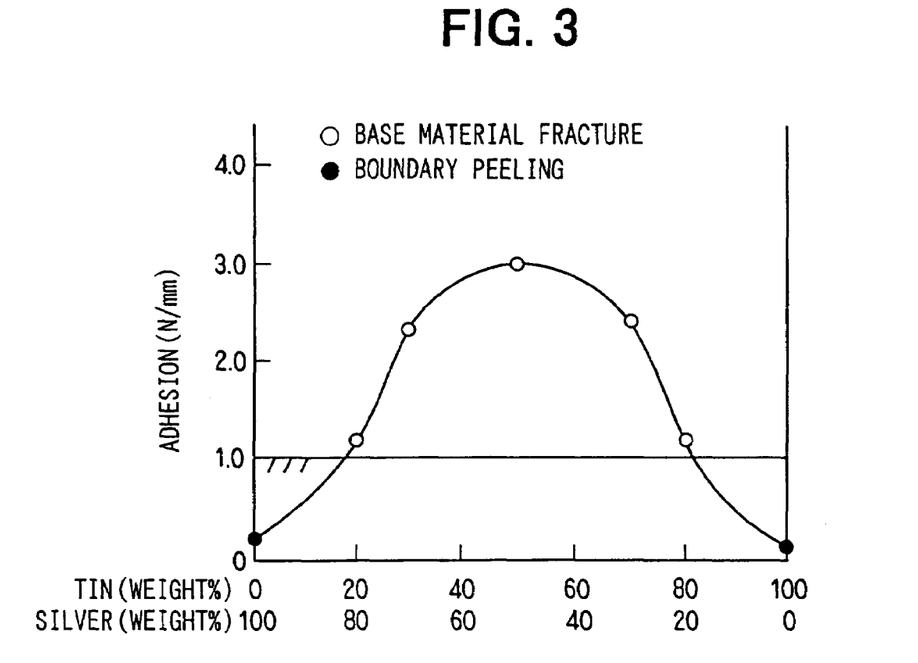
FIG. 3 is a graph showing the results of an evaluation of adhesion between a copper foil and a conductive compound, where adhesion is represented by the vertical axis, and the quantities of tin and silver in the compound are represented on the horizontal axis.

FIG. 3 is a result of an evaluation conducted by the inventors of the adhesion between the copper foil forming the conductor patterns 22 and the conductive compound 51. FIG. 3 shows the variation in adhesion when the ratio of tin to silver in the conductive paste is varied.

To explain the evaluation procedures, first, the same tin particles and silver particles that were used for the conductive paste 50 described above were used as metal components. Terpineol was added to the metal components in an amount equivalent to 10 weight % of the metal components, and the mixture is treated to create a paste. The paste is printed on the shiny side of a copper foil and the terpineol is evaporated under the conditions described above. Subsequently, another copper foil is stacked on the paste such that the matte side thereof contacts the paste. The two copper foils and the conductive compound between them are bonded by the hot-press under the conditions described above.

The reason that the shiny side of one copper foil and the matte side of the other copper foil face the paste is that a via hole packed with the conductive compound is formed between such sides when the single-sided conductor pattern films are stacked in the fabrication of the printed wiring board; that is, each film faces the same direction in the printed wiring board. The bonded two copper foils are peeled at the speed of 10 mm/min and the peeling strength is defined as the adhesion between the foils.

It turns out that a tin content between 20–80% provides a good level of adhesion (more than 1.0 N/mm). That is, a higher level of adhesion than that between the insulator and the copper foil is provided. The fracture mode in the peeling in of the material in the 20–80% tin content range is not boundary peeling between the copper foil and the conductive compound, but peeling due to internal fracturing of the conductive compound. Thus, a solid phase diffusion layer that is stronger than the conductive compound is formed between the copper foil and the conductive compound. Thus, the reliability of an interconnection that employs the solid phase diffusion layer is high.

Figure 4:
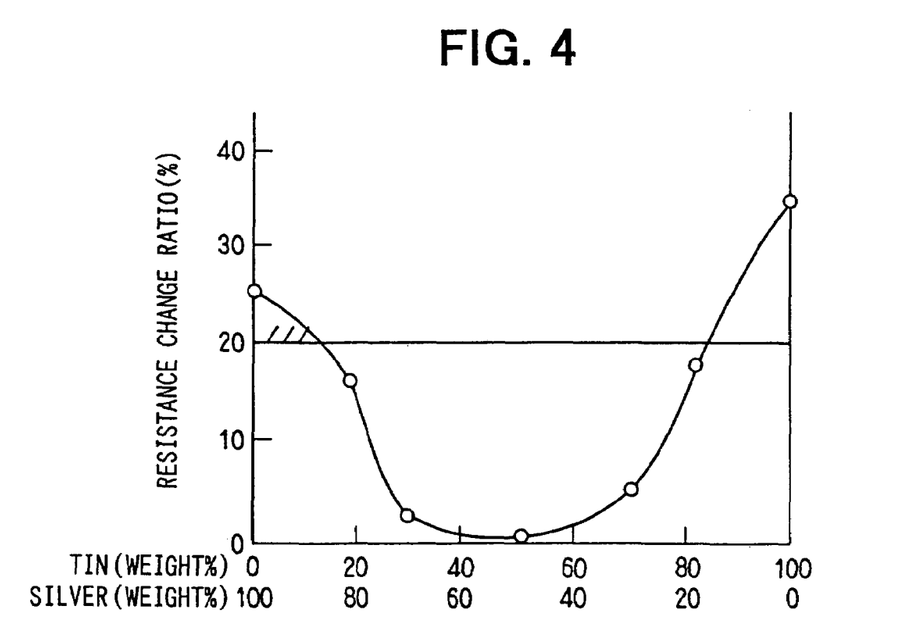
FIG. 4 is a graph showing the change ratio in the via serial resistance of the printed wiring board of this invention, where resistance change ratio is represented by the vertical axis, and the quantities of tin and silver in the compound is represented on the horizontal axis.

FIG. 4 is a result of an evaluation conducted by the inventors of the reliability of the interconnection and is a graph showing the variation in the resistance change ratio of the via serial resistance in the printed wiring board to the initial via serial resistance after a re-flow soldering process when the ratio of tin to silver in the conductive paste packed in the via hole is varied.

To explain the evaluation procedures, first, the same tin particles and silver particles that were used for the conductive paste 50 described above were used as the metal components in this evaluation. Terpineol was added to the metal components in an amount equivalent to 10 weight % of the metal components, and the mixture was treated to create a paste. The paste was packed in the via hole of the single-sided conductor pattern film and the terpineol was evaporated under the conditions described above. A copper foil was adhered to the insulator side of the single-sided conductor pattern film. The stacked unit is hot-pressed under the conditions described above. A double-sided board having conductor patterns for measuring via serial resistance is thus prepared.

Then, via serial resistance of the double-sided board was measured, and via serial resistance is again measured after the board is passed through a re-flow process at a temperature of 250 degrees for a period of 5 minutes. Then, the ratio of these values was calculated. This ratio is referred to as the resistance change ratio.

It turned out that a tin content between 20–80% ensures that the resistance change ratio is 20% or less, which is generally the maximum figure to provide good reliability.

It is possible to provide a printed wiring board with excellent connection reliability if the printed wiring board is manufactured by using, as an interlayer connecting material, the conductive paste 50 with 20–80% tin content, as described above.

In this embodiment, the temperature in the interlayer connecting process is 240–350 degrees. The heating temperature is preferably at least 220 degrees or more.

Figure 5:
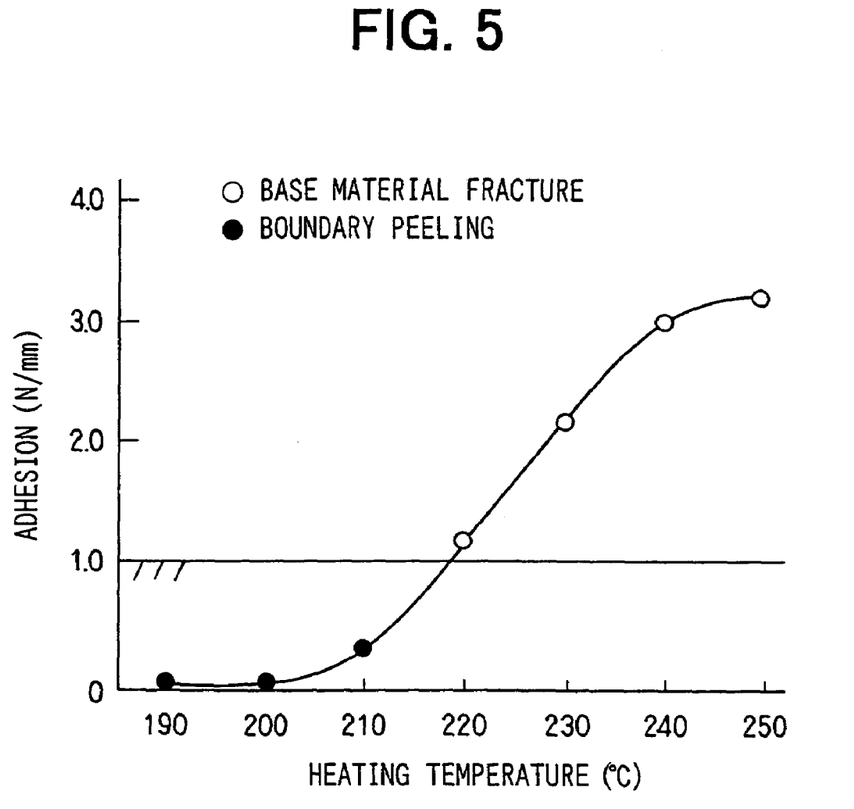
FIG. 5 is a graph showing the results of an evaluation of adhesion between a copper foil and the conductive compound, where adhesion is represented by the vertical axis and the heating temperature of the compound is represented on the horizontal axis.

FIG. 5 is the result of an evaluation conducted by the inventors on the dependency of adhesion between the copper foil forming the conductor pattern and the conductive compound on heating temperature. FIG. 5 shows the variation of the adhesion between the copper foil and the conductive compound when the heating temperature is varied.

To explain the evaluation procedures, first, the conductor paste 50 is printed on the shiny side of a copper foil and the terpineol was evaporated under conditions described above. Subsequently, another copper foil is stacked on the paste such that the matte side thereof contacts the paste. The two copper foils and the conductive compound between them are bonded by pressing under the conditions described above at heating temperatures varied on a sample-by-sample basis.

The reason that the shiny side of one copper foil and the matte side of the other copper foil face the paste is that a via hole packed with the conductive compound is formed between such sides when the single-sided conductor pattern films are stacked in the fabrication of the printed wiring board; that is, each film faces the same direction in the printed wiring board. The bonded two copper foils are peeled at the speed of 10 mm/min and the peeling strength is defined as the adhesion between the foils.

The results show that a heating temperature higher than 220 degrees provides adhesion (the adhesion between the insulator and the copper foil) of more than 1.0 N/mm, which is preferred. The fracture mode in the peeling of the material in the 20–80% tin content range is not boundary peeling between the copper foil and the conductive compound, but peeling due to internal fracturing of the conductive compound. This means that a solid phase diffusion layer that is stronger than the conductive compound is formed between the copper foil and the conductive compound.

As described above, a heating temperature higher than 220 degrees in the interlayer connecting process provides a good interlayer connection between the conductive compound and the solid phase diffusion layer.

In this embodiment, the pressure of the hot-pressing of the interlayer connecting material (50) is 2–10 MPa. The pressing pressure is preferably 0.5 MPa or more. If the pressing pressure is lower than 0.5 MPa, the metal particles are not sufficiently unified by sintering, and the solid phase diffusion layer is not sufficiently formed. The inventors have confirmed that a satisfactory interlayer connection is ensured by setting the pressing pressure to 0.5 MPa or more.

In the evaluation mentioned above, a copper foil, which has a matte side on which rust preventive film is formed, is used. Such a foil provides a good interlayer connection.

(Second Embodiment)

Hereinafter, second embodiment of the present invention is explained with reference to the figures.

The second embodiment is different from the first embodiment in the composition of the conductive paste 50 and the process conditions after the packing process to improve the shape-retention of the conductive paste 50. Therefore, the reference numerals used in the first embodiment are also used for the corresponding parts of this embodiment, and a detailed explanation thereof is omitted.

After the formation of the conductor pattern 22 and the via hole 24 is completed, as in the first embodiment, as shown in FIGS. 1(*a*) and 1(*b*), conductive paste 50 for interlayer connection is packed in the via hole 24 of the single-sided conductor pattern film 21 as shown in FIG. 1(*c*).

The paste is prepared by the steps mentioned below. Terpineol, the quantity of which is 60 g, is added to 300 g of tin particles. The mean particle size of the tin particles is 5 $\mu$m, and the specific surface area of the tin particles is 0.5 m$^2$/g. Further, 300 g of silver particles are added. The silver particles have a mean particle size of 1 $\mu$m and a specific surface area of 1.2 m$^2$/g. In addition, indium particles (binder particles), the quantity of which is 6 g, the mean particle size of which is 3 $\mu$m, and the specific surface area of which is 0.8 m$^2$/g, are added. The mixture is treated by a mixer to make paste.

After packing the conductive paste 50, the terpineol is evaporated for 30 minutes at 140–160 degrees. After the evaporation of the terpineol is completed, the single-sided conductor pattern film 21 is heated at 180–200 degrees.

Figure 6A:
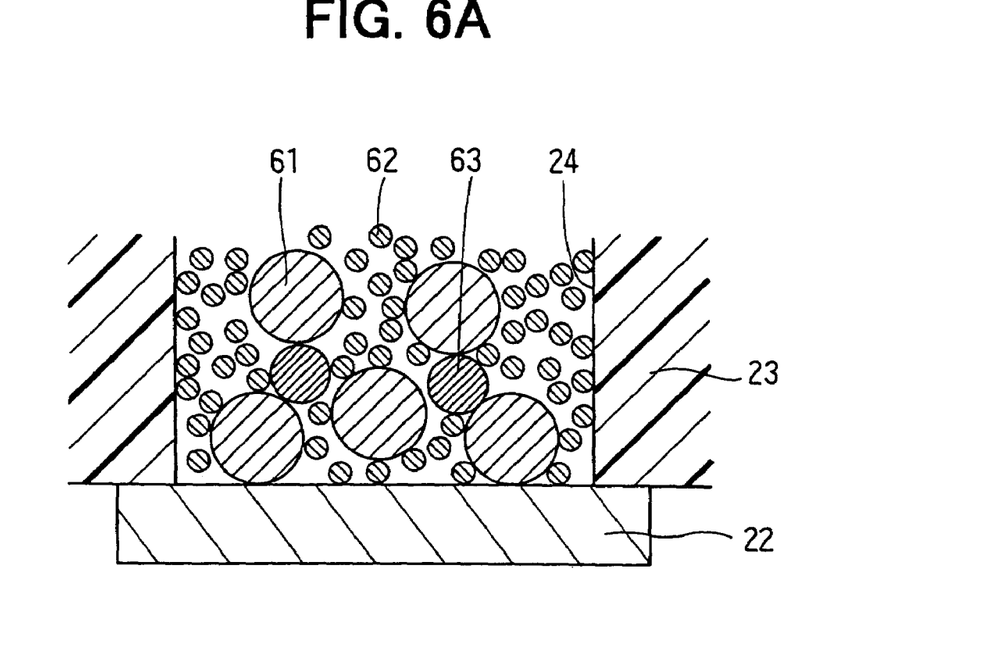
FIG. 6(a) is a view like FIG. 2(a) showing a step in the manufacture of a printed wiring board according to a second embodiment.
Figure 6B:
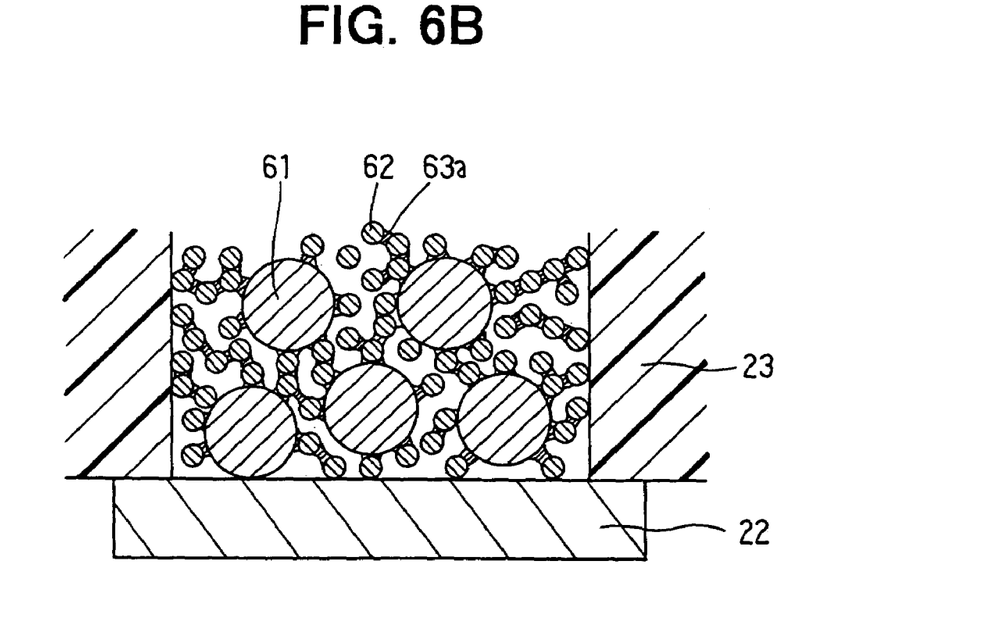
FIG. 6(b) is a view like FIG. 2(b) showing a further step in the manufacture of the printed wiring board of FIG. 6(a)

Before the heating, there are only indium particles 63 mixed with the tin particles 61 and the silver particles 62 in the via hole 24, as shown in FIG. 6(*a*). The indium particles 63 have a melting point of 160 degrees, thus the indium particles 63 are fused by the heat, and an indium portion 63*a* interconnects the tin particles 61 and the silver particles 62, as shown in FIG. 6(*b*). During the heating, part of the indium portion 63*a* diffuses into the tin particles 61 and the silver particles 62, and each particle is firmly interconnected after cooling.

Consequently, the shape-retention of the conductor paste 50 is dramatically improved. Therefore, the conductor paste 50 resists dropping away in later processes.

The interconnection between the metal particles with the indium portion 63*a* is implemented by heating at 180–200 degrees in this embodiment. However, other temperature may be used as long as the temperature is lower than the melting point (232 degrees) of tin and the melting point (961 degrees) of silver (That is, lower than the melting point of tin, since the melting point of tin is the lower of the two). The metal particles are interconnected without fusing the tin particles 61 and the silver particles 62. In addition, the metal particles may be interconnected via indium by hot pressing rather than merely heating. For example, it is possible to interconnect the metal particles by letting a part of the indium diffuse into the tin particles 61 and the silver particles 62 by hot-pressing at 140–160 degrees between heating rollers or the like.

In this embodiment, indium particles 63 are used as a binder. However, other metal particles may be used as the binder as long as the particles have a lower melting point than those of tin and silver, and diffuse into the tin particle 61 and the silver particle 62.

On completion of the packing of the conductor paste 50 in the via hole 24 and the evaporation and heating, as shown in FIGS. 1(*d*) and 1(*e*), a multilayer printed wiring board 100 is made by the same steps that are performed in the first embodiment. When the conductive compound 51 is formed in the via hole 24, the indium is absorbed into the conductive compound 51 by diffusion.

According to the configuration and fabrication method described above, the same effects and advantages that result from the first embodiment are produced. In addition, the interlayer connecting material 50, after being packing into the via hole 24, has better shape-retention and resists falling from the via hole (24). Therefore, the reliability of the interconnection is improved.

It is possible to add binder resin to the conductor paste 50 to improve its shape-retention. However, excessive addition of binder resin is likely to increase the interlayer connecting resistance in the interlayer connecting process.

The materials and process conditions not explained in this embodiment are the same as those of the first embodiment.

(Third Embodiment)

Hereinafter, a third embodiment of the present invention is explained by referring to the figures. The third embodiment differs from the first and second embodiments in the composition of the conductive paste 50 and in the process conditions that take place after the packing process to improve the shape-retention of the conductive paste 50. The same reference numerals used in the first embodiment are used for corresponding parts of this embodiment, and a detailed explanation thereof is omitted.

After the formation of the conductor pattern 22 and the via hole 24 is completed, as in the first embodiment, as shown in FIGS. 1(*a*) and (*b*), the conductive paste 50, which is for interlayer connection, is packed in the via hole 24 of the single-sided conductor pattern film 21 as shown in FIG. 1(*c*).

Terpineol, the quantity of which is 60 g, is added to 300 g of tin particles. The mean particle size of the tin particles is 5 $\mu$m, and the specific surface area of the tin particles is 0.5 m$^2$/g. Further, 300 g of relatively large silver particles are added. The relatively large silver particles have a mean particle size of 1 $\mu$m and a specific surface area of 1.2 m$^2$/g. Also, 0.6 g of relatively small silver particles, which serve as binder particles and have a mean particle size of 5–7 nm, are added. The mixture is mixed to a paste by a mixer.

On completion of the packing of the conductive paste 50, the terpineol is evaporated for 30 minutes at 140–160 degrees. After the evaporation of the terpineol is completed, the single-sided conductor pattern film 21 is hot-pressed at 140–160 degrees between heating rollers or the like.

Figure 7A:
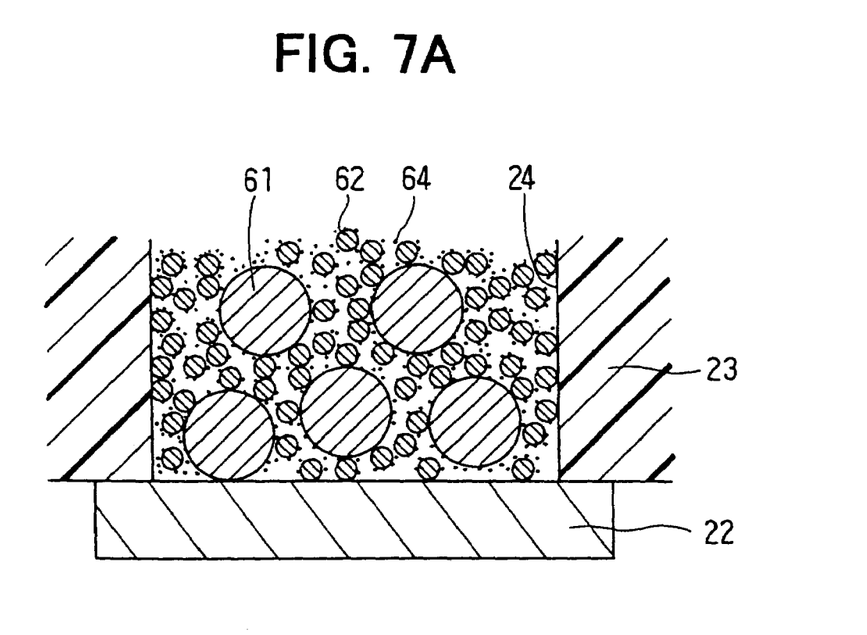
FIG. 7(a) is a view like FIG. 1(a) showing a step in the manufacture of a printed wiring board according to a third embodiment.
Figure 7B:
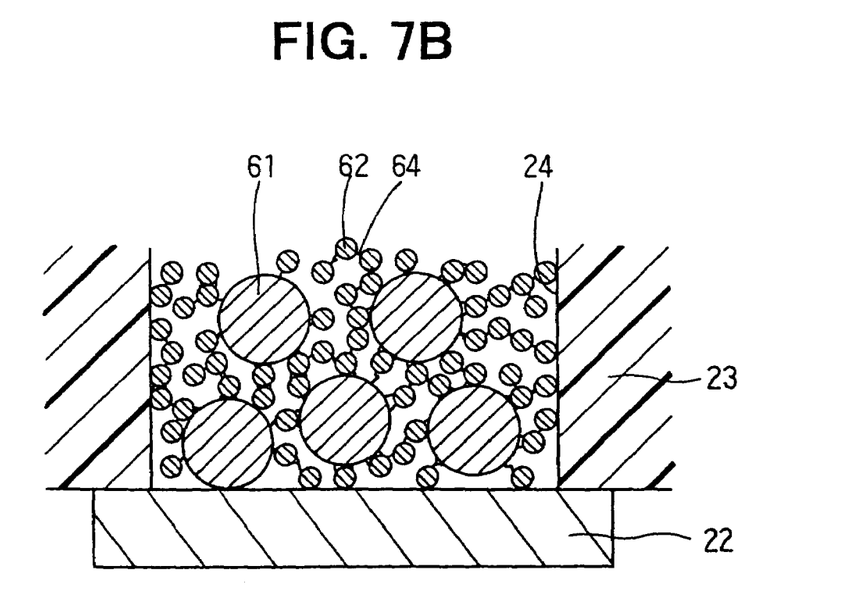
FIG. 7(b) is a view like FIG. 2(b) showing a further step in the manufacture of the printed wiring board of FIG. 7(a)

Before the heating, the small silver particles 64, which have a mean particle size of 5–7 nm, are mixed with the tin particles 61 and the relatively large silver particles 62, which have a mean particle size of 1 $\mu$m, in the via hole 24, as shown in FIG. 7(*a*). The small silver particles 64 have such a large surface energy that parts of the small silver particles 64 diffuse into the tin particles 61 and the large silver particles 62 as a result of the heating, which interconnects the tin particles 61 and the large silver particles 62, as shown in the FIG. 7(*b*). When the conductive compound 51 is formed in the via hole 24, the silver of the small silver particles 64 is absorbed into the conductive compound 51 by diffusion Therefore, the shape-retention of the conductor paste 50 is dramatically improved, and the conductor paste 50 is prevented from dropping away in later processes.

The interconnection between the metal particles 61,62 and the small silver particles 64 is produced by hot-pressing at 140–160 degrees in this embodiment. However, other temperatures may be used as long as the heating temperature is lower than the melting point (232 degrees) of tin. The metal particles are interconnected without fusing the tin particles 61 and the large silver particles 62. In addition, by just heating, without hot-pressing, the metal particles may be interconnected via the small silver particles 64.

In this embodiment, the small silver particles 64 are used as binder particles. However, other metal particles may be used as long as the particles have a particle size of 1–100 nm and diffuse into the tin particles 61 and the large silver particles 62. If the particle size is larger than 100 nm, it is difficult to interconnect the particles at a lower temperature than the melting point of tin because the surface energy becomes lower. In addition, particles smaller than 1 nm are unfavorable due to the difficulty and high cost of fabricating such particles.

Upon completion of the packing of the conductor paste 50 in the via holes 24 and the improvement in the shape-retention through evaporation and heating, as shown in FIGS. 1(*d*) and 1(*e*), the multilayer printed wiring board 100 is provided through the same processes used in the first embodiment.

According to the configuration and fabrication method described above, the same effects and advantages that result from the first embodiment are provided. In addition, the interlayer connecting material 50, after being packing into the via hole 24, has an improved shape-retention and is prevented from dropping away from the via hole (24). Therefore, the interconnection is more reliable.

It is possible to add binder resin to the conductor paste 50 to improve its shape-retention. However, excessive addition of the binder resin will increase the interlayer connecting resistance in the interlayer connecting process. In this invention, binder resin is not needed and it is thus it is not necessary to increase the interlayer connecting resistance.

(Fourth Embodiment)

The fourth embodiment of the present invention is explained as follows by referring to the figures. The fourth embodiment is different from the first embodiment in the composition of the conductive paste. Therefore, the same numerals used in the first embodiment are used for the corresponding parts of this embodiment, and a detailed explanation thereof is omitted.

After the formation of the conductor pattern 22 and the via hole 24 is completed according to the same steps used in the first embodiment, as shown in FIGS. 1(*a*) and (*b*), the conductive paste 50 is packed in the via holes 24 of the single-sided conductor pattern film 21, as shown in FIG. 1(*c*). FIG. 1(*c*) shows the state where the conductor pattern 50 is packed. However, in this embodiment, a conductor paste 250, which serves as an interlayer connecting material, is packed as shown in FIG. 8(*a*).

The paste 250 is prepared by the following steps. Terpineol, the quantity of which is 60 g, is added to 300 g of relatively large zinc particles. The mean particle size of the large zinc particles is 1 $\mu$m, and the specific surface area of the large zinc particles is 1.2 m$^2$/g. Further, 300 g of relatively small zinc particles are added. The small zinc particles have a mean particle size of 5–10 nm. The mixture is made into a paste by a mixer.

On completion of the packing of the conductive paste 250, the terpineol is evaporated for 30 minutes at 140–160 degrees. After the conductor paste 250 is packed in the via hole 24 and after the terpineol is evaporated, as shown in FIGS. 1(*d*) and 1(*e*), the multilayer printed wiring board 100 is formed through the same steps employed in the first embodiment. FIG. 1(*e*) shows the printed wiring board 100. The printed wiring board 200 of this embodiment, the layers of which are interconnected, is shown in FIG. 8(*a*).

Figure 8A:
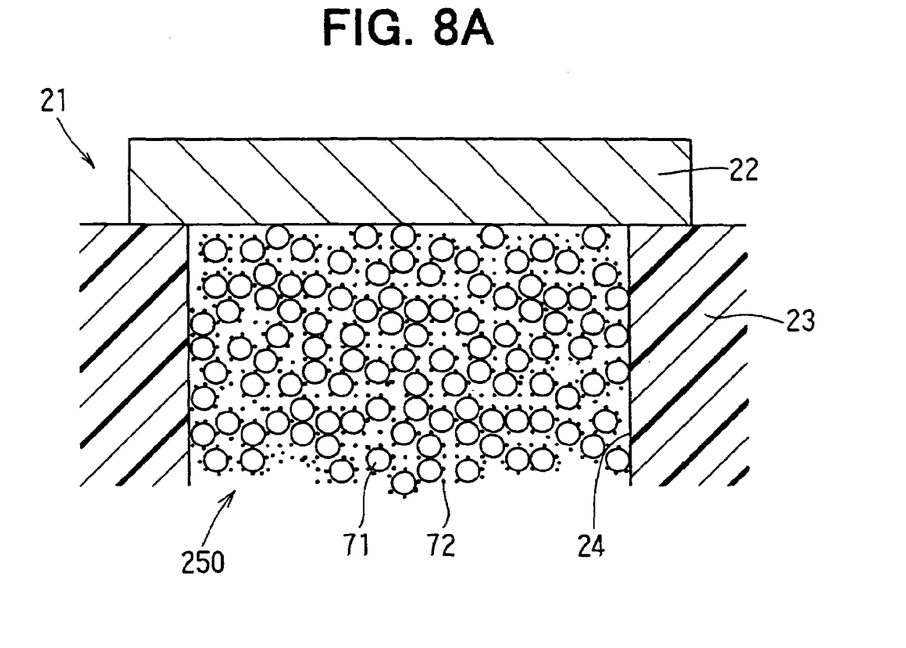
FIG. 8(a) is a view like FIG. 1(a) showing a step in the manufacture of a printed wiring board according to a fourth embodiment.
Figure 8B:
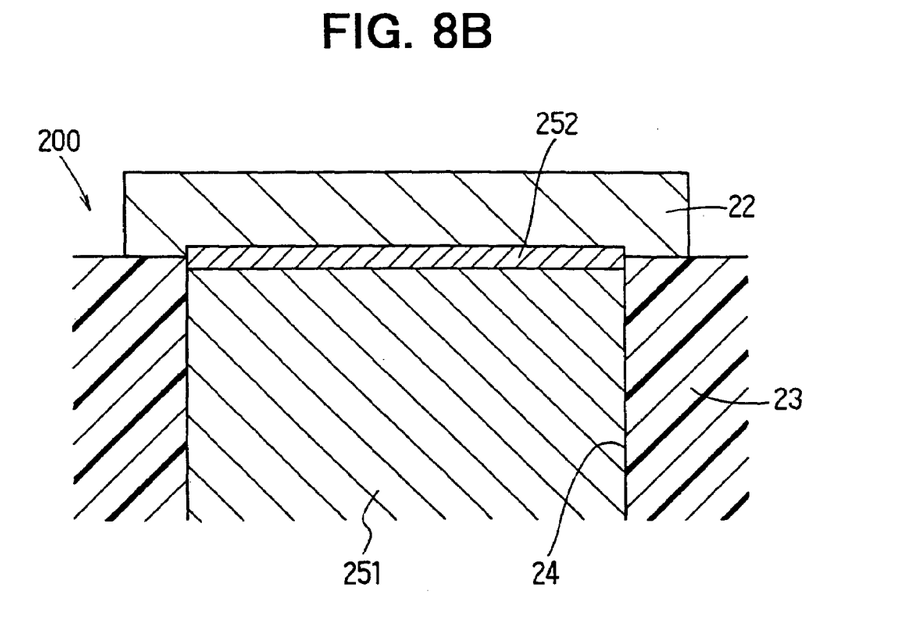
FIG. 8(b) is a view like FIG. 2(b) showing a further step in the manufacture of the printed wiring board of FIG. 8(a)

The interconnection will now explained by referring to FIGS. 8(a) and 8(b). FIGS. 8(a) and 8(b) are partial, enlarged views showing, diagrammatically, the via hole 24. Before being heated by the vacuum hot-press machine, the paste 250 packed in the via hole 24, after the evaporation, is in the state shown in FIG. 8(a). That is, both the large zinc particles 71 and the small zinc particles 72 are mixed.

When the paste 250 is heated at 240–350 degrees, the small zinc particles 72 fuse and interconnect the large zinc particles 71. The small zinc particles 72 fuse due to their significantly large surface energy, and the large zinc particles 71, the melting point of which is 419 degrees, do not fuse.

After the interconnection of the large zinc particles 71, as shown in FIG. 8(b), a conductive compound 251 made of unified zinc is formed in the via hole 24, because the conductive paste 250 is under a pressure of 2–10 MP.

In addition, while the conductive compound 251 is formed in the via holes 24, the pressurized conductive compound 251 is pressed toward the surfaces forming the bottoms of the via holes 24. Therefore, the zinc in the conductive compound 251 and the copper in the copper foil forming the conductor pattern 22 diffuse mutually, and a solid phase diffusion layer 252 is formed at the interface between the conductive compound 251 and the conductor pattern 22.

Although not shown in FIG. 8, a similar solid phase diffusion layer is formed between the zinc in the conductive compound 251 and the copper in the copper foil forming the conductor patterns 22 in the via holes that are oppositely oriented, that is, those that are closed by a conductor pattern 22 at the bottom side. Therefore, both the conductor patterns 22 at the top and the bottom of the via holes 24 are electrically interconnected with the unified conductive compound 251 and the solid phase diffusion layer 252.

According to the configuration and fabrication method described above, electrical interconnection between the conductor patterns 22 is not achieved by mechanical contact, thus the interlayer contact resistance hardly changes. Therefore, the reliability of the interconnection is improved. In addition, as in the first embodiment, unification of the single-sided conductor pattern films 21 and the cover layer 36a, 36b and interconnection of the conductor patterns 22 are performed simultaneously by the hot-press. Therefore, the number of fabrication steps for the printed wiring board 200 is reduced, which reduces the fabrication costs of the boards.

In this embodiment, the small zinc particles 72 serve as fine metal particles. The preferred particle size thereof is 1–500 nm. A particle size larger than 500 nm makes it difficult to interconnect the zinc particles 71 at lower temperature than the melting point of zinc because surface energy is lower. In addition, particles having particle size smaller than 1 nm are difficult and expensive to produce. The particle size of the small zinc particles is more preferably 1–100 nm.

In this embodiment, the heating temperature in the interlayer connecting process is 240–350 degrees. However, the heating temperature is preferably at least 220 degrees or more. The inventors have confirmed that the conductive compound 251 and the solid phase diffusion layer 252 are properly formed and good interlayer connection is ensured at heating temperatures higher than 220 degrees.

In this embodiment, the pressing pressure in the interlayer connecting process is 2–10 MPa. The pressing pressure is preferably 0.5 MPa or more. If the pressing pressure is lower than 0.5 MPa, the zinc particles are not properly unified, and the solid phase diffusion layer is not properly formed. The inventors have confirmed that a satisfactory interlayer connection is ensured by setting the pressing pressure to 0.5 MPa or more.

(Other Embodiments)

In the first, second, and third embodiments described above, tin particles are used as the first metal particles. However, other metal particles may be used as long as the metal particles diffuse mutually and form alloy with the metal (copper in each example mentioned above) making up the conductor pattern. Applicable metals are indium and the like. The first metal particles may be made of a single metal or a mixture of different metals.

In the first, second, and third embodiments described above, silver particles are used as the second metal particles. However, other metal particles may be used as long as the particles do not fuse during the interconnecting period and form an alloy with the first metal particles. Applicable metals are copper (melting point, 1083 degrees), gold (melting point, 1063 degrees), platinum (melting point, 1769 degrees), palladium (melting point, 1552 degrees), nickel (melting point, 1453 degrees), zinc (melting point, 419 degrees) or the like. The second metal particles may be made of a single metal or a combination of different metals.

Figure 9A:
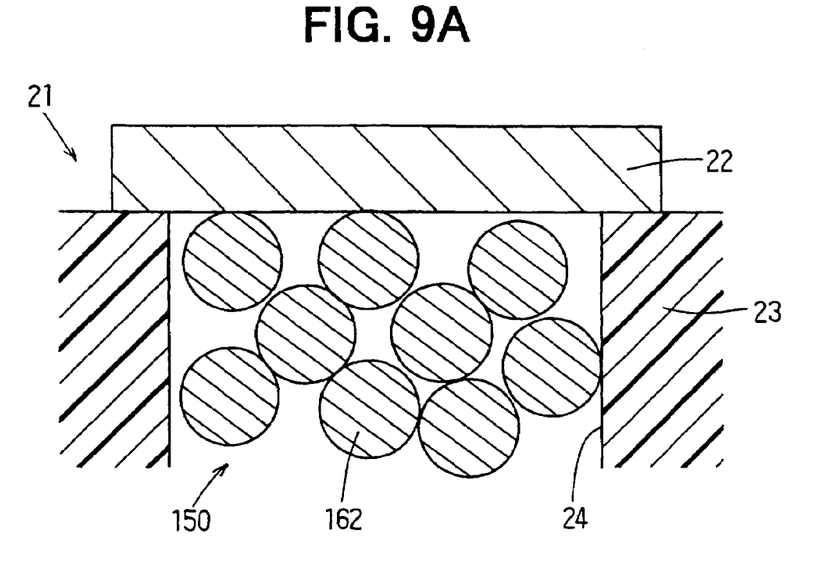
FIG. 9(a) is a view like FIG. 1(a) showing a step in the manufacture of a printed wiring board according to a further embodiment.
Figure 9B:
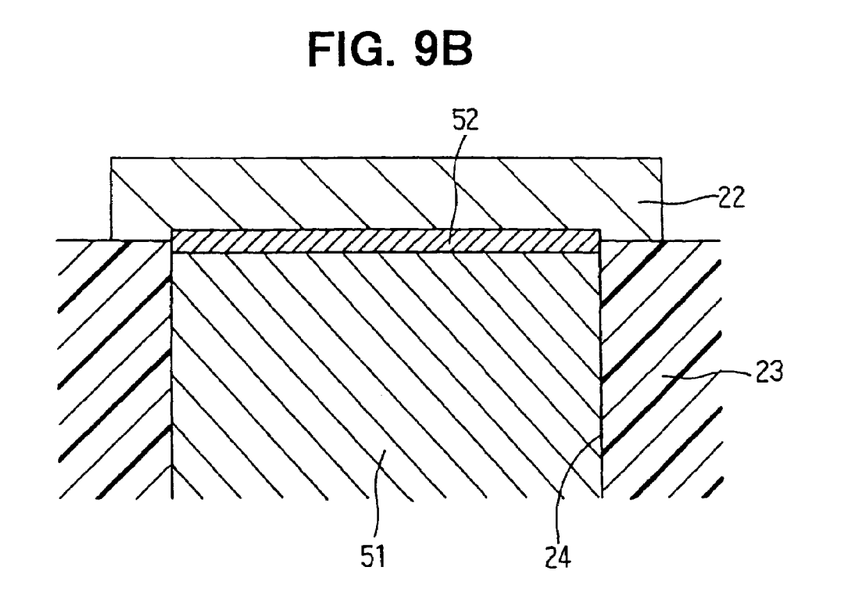
FIG. 9(b) is a view like FIG. 2(b) showing a further step in the manufacture of the printed wiring board of FIG. 9(a)

In the first, second, and third embodiments described above, the conductive paste 50, which includes the first and the second metal particles, is applied. However, it is possible to use conductive paste that includes alloy particles, each of which is formed by an alloy of the first metal and the second metal. For example, as shown in FIG. 9(a), conductive paste 150, which includes organic solvent and alloy particles 162, each of which includes 50 weight % tin and 50 weight % silver, is packed in the via holes 24 of the single-sided conductor pattern film 21 and subjected to evaporation. Afterward, the single-sided conductor pattern films 21 are preferably stacked and the stacked unit is hot-pressed from both sides to form the unified conductive compound 51 by sintering the alloy particles in the via hole 24, as shown in FIG. 9(b).

The conductive compound 51 is pressurized while being pressed in the via hole 24 so that the compound 51 is pressed toward the surface of the conductor patterns 22 that form the bottoms of the via holes 24. Thus, the tin in the conductive compound 51 and the copper of the copper foil forming the conductor pattern 22 diffuse mutually in solid phase to form the solid phase diffusion layer 52 at the boundary between the conductive compound 51 and the conductor pattern 22. In this way the effects and advantages of the first embodiment result.

The first metal is not limited to tin. As described above, indium or the like may be used either separately or in combination. Moreover, the second metal is not limited to silver. As described above, copper, gold, platinum, palladium, nickel, zinc or the like are applicable either separately or in combination.

The metal components of the conductive paste 150 are 50 weight % tin and 50 weight % silver. As in the first, second, and third embodiments described above, the tin content of the metal components is preferably 20–80%.

In the fourth embodiment, the conductive paste 250 contains both the large zinc particles 71 and the small zinc particles 72. However, other metal particles are may be used as long as the particles diffuse mutually and form an alloy with the metal (copper in above-mentioned example) making up the conductor pattern. Applicable metals are aluminum, nickel and the like. These metals may be used separately or in combination as the large metal particle and the small, or fine, metal particle.

In addition, the conductive paste 250 may be the one that contains only fine, or small, metal particles that diffuse and form an alloy with the metal making up the conductor pattern. That is, the paste 250 does not contain large metal particles. Many configurations are effective as long as it is possible to form the conductive compound in the via hole by fusing the fine metal particles during the interlayer connecting process and to form a mutual solid phase diffusion layer between the formed conductive compound and the conductor pattern.

Namely, the metal making up the fine metal particles need not diffuse mutually and form an alloy with the metal making up the conductor pattern as long as the large metal particles form an alloy with the fine metal particles and the large metal particles diffuse mutually with and form alloy with the metal making up the conductor pattern. Similarly, if the metal making up the fine metal particles diffuses mutually with and forms an alloy with the metal making up the conductor pattern, the metal making up the large metal particles need not form alloy with the metal making up the conductor pattern as long as the large metal particles diffuse mutually with and form an alloy with the metal making up the fine metal particles.

In other words, if the two metals making up the large metal particles and the small metal particles mutually form an alloy, any metal combination works fine as long as at least one of the two metals making up either the large metal particles or the fine metal particles diffuses mutually with and forms an alloy with the metal making up the conductor pattern. Therefore, for example, the following metal configurations are applicable. At least one metal of zinc, aluminum, and nickel is used for the large metal particles and at least one metal of silver, copper, gold, platinum, and palladium is used for the fine metal particles. In addition, the opposite combinations are may be used.

In the first embodiment, there are only first metal particles and second metal particles in the paste 50. In the second and third embodiments, first metal particles, second metal particles and the binder particles are included in the paste. However, other metal particles that do not form an alloy with tin may be added to the paste 50. For example, for adjusting the thermal expansion coefficient of the conductive compound 51 to approximate that of the insulator resin film 23, other metal particles, nonconductive inorganic filler or the like may be added. However, excessive amounts of such other materials may hinder the unification of the conductive compound 51.

In the fourth embodiment, only the large metal particles and the fine metal particles are included in the paste 250. However, other metal particles that do not form an alloy with the metal particles may be included. For example, for adjusting the thermal expansion coefficient of the conductive compound 251 to approximate that of the insulator resin film 23, other metal particles, nonconductive inorganic filler or the like may be added. However, excessive amounts of such other materials may hinder unification of the conductive compound 251.

Furthermore, in each embodiment described above, the single-sided conductor pattern films 21 are stacked, as shown in FIG. 1(d), in the fabrication processes of the printed wiring board. However, the stacking configuration is not limited to this one, but other configurations are usable as long as the configurations are for a multilayer or double-sided printed wiring board requiring interlayer connection.

Figure 10:
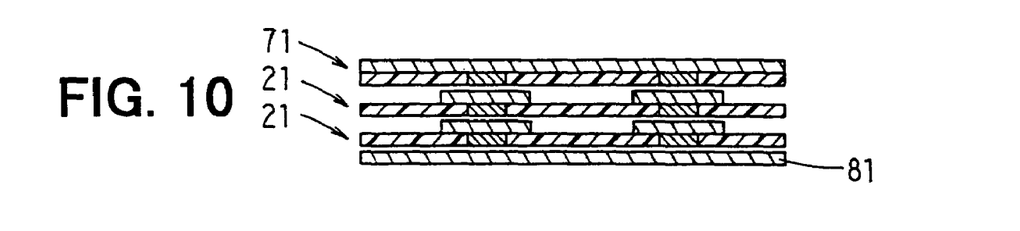
FIG. 10 is a diagrammatic cross sectional view showing a stacking step in the manufacture of printed wiring boards according to a further embodiment of the present invention.
Figure 11:
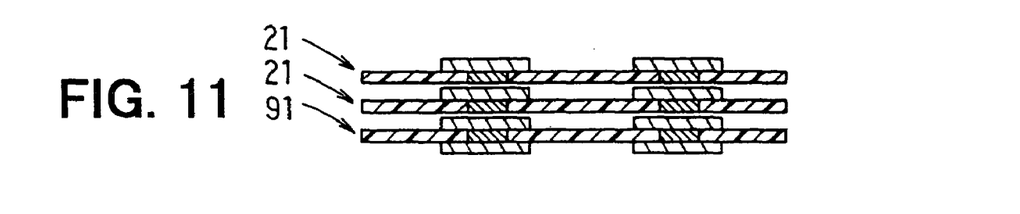
FIG. 11 is a view like FIG. 10 showing a stacking step in the manufacture of printed wiring boards according to a further embodiment of the present invention.
Figure 12:
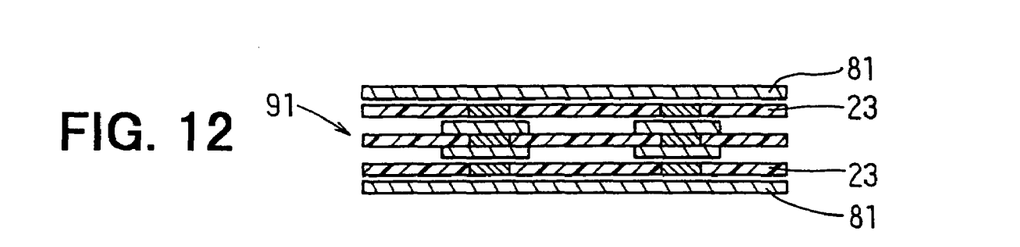
FIG. 12 is a view like FIG. 10 showing a stacking step in the manufacture of printed wiring boards according to a further embodiment of the present invention.

For example, a configuration shown in FIG. 10 is possible. In FIG. 10, a multilayer printed wiring board is made by stacking a single-sided conductor pattern film 71 having a copper foil conductor pattern covering a whole side thereof, single-sided conductor pattern films 21, and a copper foil 81. Then, the stack is hot-pressed. Afterward, the copper foils are defined on both sides. Another configuration, which is shown in FIG. 11, is also possible. In FIG. 11, another multilayer printed wiring board is made by stacking single-sided conductor pattern films 21 and a double-sided film 91. Afterward the stacked unit is hot-pressed. Moreover, other configurations, such as that shown in FIG. 12 are possible. In FIG. 12, another multilayer printed wiring board is made by stacking the resin film 23 on both sides of the double-sided film 91. Then, the copper foils 81 are added to the stacked unit as shown. Afterward, the stacked body is hot-pressed.

Figure 13:
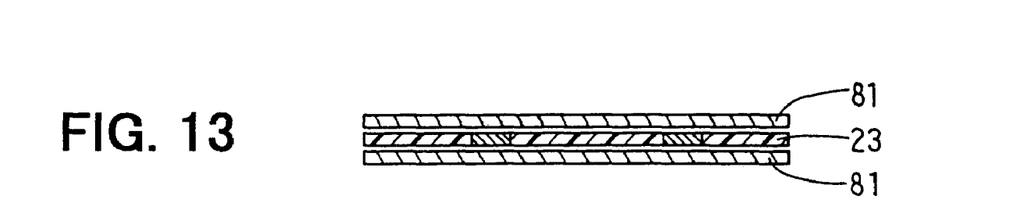
FIG. 13 is a view like FIG. 10 showing a stacking step in the manufacture of printed wiring boards according to a further embodiment of the present invention.
Figure 14:
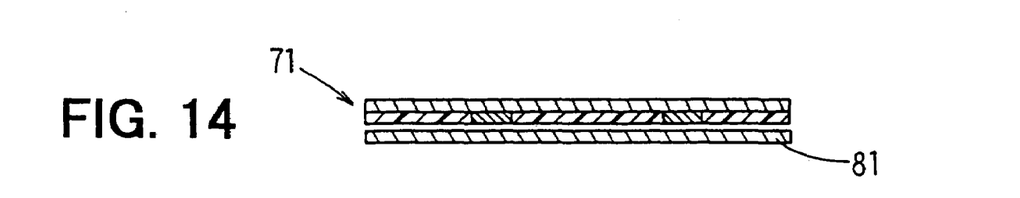
FIG. 14 is a view like FIG. 10 showing a stacking step in the manufacture of printed wiring boards according to a further embodiment of the present invention.

Another configuration is shown in FIG. 13. In FIG. 13, another multilayer printed wiring board is made by stacking the copper foils on the resin film 23, hot-pressing the stacked unit, and then defining the copper foils on both sides. In another configuration, which is shown in FIG. 14 another multilayer printed wiring board is made by stacking the single-sided conductor pattern film 71, which has a copper foil conductor pattern covering a whole side thereof, with the copper foil 81. Then the stack is hot-pressed. Afterward, copper foils are defined on both sides.

In each embodiment, a resin film made of a mixture of 65–35% polyetheretherketone resin and 35–65% polyetherimide resin is used for the resin film 23 and the cover layers 36a and 36b. Instead of this film, it is possible to use a film made by adding nonconductive filler to polyetheretherketone resin and polyetherimide resin. It is also possible to use separately polyetheretherketone (PEEK) or polyetherimide (PEI).

In addition, applicable materials for the resin film and the cover layer are polyethylene naphthalate (PEN), polyethylene terephthatlate (PET), polyether sulphone (PES), thermoplastic polyimide or, what is called liquid crystal polymer and the like. It is also possible to use a structure in which polyetherimide film is laminated by at least one of PEEK, PEI, PEN, PET, PES, thermoplastic polyimide and liquid crystal polymer. Other resin films may be employed as long as the films are bonded together by hot-pressing and have the thermal resistance required in a later soldering process.

If a polyetherimide film laminated by a thermoplastic resin layer is applied, problems such as peeling and warping are preventable because the 15–20 ppm thermal expansion coefficient of the polyimide is close to that (17–20 ppm) of copper, which is the typical material used for wiring.

In the case of a double-sided printed wiring board, for example, thermosetting resin such as epoxy resin, bismaleimide triazine (BT), polyphenylene ether (PPE), and polyimide (PI) in B stage are usable. Even in the case of a multilayer printed wiring board, thermosetting resin such as epoxy resin, BT, PPE, and PI in B stage are usable for so-called build-up construction method.

In each embodiment described above, copper is used as the metal making up the conductor pattern 22. However, in the first, the second, the third embodiments, other than copper, it is possible to use metals that diffuse mutually in the solid phase with the first metal (tin in each example mentioned above) in the conductive compound 51. In addition, the conductor pattern 22 does not have to be entirely made of metal that diffuses mutually with the first metal in the conductive compound 51. It is possible to use a conductor pattern having a plated layer made of a metal such as silver and gold that diffuses mutually with tin (the first metal) contained in the conductive compound 51. Any conductor patterns are applicable as long as the patterns have metal that can diffuse mutually with the first metal contained in the conductive compound 51 at the position correspondent to the via hole 24.

In the fourth embodiment, other than copper, it is possible to use metals that diffuse mutually in the solid phase with the metal component (zinc in the example mentioned above) in the conductive compound 251. In addition, the conductor pattern 22 does not have to be entirely made of metal that diffuses mutually with the metal component contained in the conductive compound 251. It is possible to use a conductor pattern having a plated layer thereon made of a metal such as silver and gold that diffuses mutually with the metal component contained in the conductive compound 251. Any conductor patterns are applicable as long as the patterns have metal that can diffuse mutually with the metal component contained in the conductive compound 251 at the position corresponding to the via hole 24.

In the first embodiment, the conductive paste 50 consists of two types of metal particles 61 and 62 and organic solvent. In the second embodiment, the conductive paste 50 consists of two types of metal particles 61, 62, and 63 and organic solvent. In the third embodiment, the conductive paste 50 consists of three types of metal particles 61, 62, and 64 and organic solvent. In the fourth embodiment, the conductive paste 250 consists of two types of metal particles 71 and 72 and organic solvent. A dispersing agent may be added to the conductive paste 50, 250 by an amount equivalent to 0.01–1.5 eight % of the solid components (e.g., the two types of metal particles 61 and 62 in the first embodiment) of the conductive paste 50, 250. This makes it easier to disperse homogeneously the metal particles in the conductive paste 50, 250. However, a dispersing agent content less than 0.01 weight % scarcely provides a dispersion effect and a dispersing agent content more than 1.5 weight % hinders the conductive compound from being unified by sintering. It is possible to use phosphoric ester and stearic ester or the like as a dispersing agent.

In each embodiment, the interlayer connecting material is the first type of conductive paste 50 or the second type of conductive paste 250. However, rather than a paste, granular material may be used as long as it is possible to pack the material in the via hole.

In each embodiment, the printed wiring boards 100, 200 consist of four layers. However, as a matter of course, as long as the board consists of a plurality of conductor pattern layers, the number thereof is not limited.

While preferred embodiments of the invention have been illustrated and described, these embodiments are capable of variation and modification and are not limited to the precise details set forth, and the invention includes variations and modifications that fall within the scope of the appended claims.

What is claimed is:

1. A method of making a printed wiring board comprising:
packing via holes formed in an insulator material with an interlayer conducting material, wherein the interlayer conducting material includes a first metal material and a second metal material, and the second metal material melts at a temperature higher than a predetermined temperature;
stacking layers of the insulator material with conductor patterns to form a stack such that the via holes are located between the conductor patterns in the stack;
forming a solid conductive material in each of the via holes to electrically connect the conductor patterns by heating the stack to the predetermined temperature and pressing the stack;
forming the interlayer conducting material as a paste prior to the packing, including adding a solvent to particles made of the metal materials;
adding binder particles to the paste; and
preheating the stack prior to the heating and pressing step and after the packing step to cause the binder particles to diffuse into the metal materials,
wherein:
the solid conductive material of each via hole includes a unified conductive layer and a solid phase diffusion layer,
the solid phase diffusion layer is formed by the first metal material and a conductor metal, and
the conductor metal is a metal of the associated conductor pattern.

2. The method according to claim 1 further comprising the step of including a binder metal in the binder particles that melts at a temperature that is lower than that at which the first metal material melts, wherein the preheating heats the stack to a temperature that melts the binder metal, and the binder metal interconnects the first metal material and the second metal material as a result of the preheating.

3. The method according to claim 1 further comprising the step of employing binder particles that have a particle size of 1–100 nm, wherein the first metal material and the second metal material are interconnected by a binder metal, which is included in the binder particles, as a result of the preheating.

* * * * *